United States Patent [19]
Her et al.

[11] Patent Number: 6,033,989
[45] Date of Patent: Mar. 7, 2000

[54] DEVICE FOR AND METHOD OF CONCENTRATING CHEMICAL SUBSTANCES FOR SEMICONDUCTOR FABRICATION

[75] Inventors: Yong-woo Her, Yongin; Heoung-bin Lim, Songnam; Byoung-woo Son, Suwon; Mi-kyung Lee, Puchon, all of Rep. of Korea

[73] Assignee: Samsung Electronics Co., Ltd., Suwon, Rep. of Korea

[21] Appl. No.: 08/974,319

[22] Filed: Nov. 19, 1997

[30] Foreign Application Priority Data

Nov. 29, 1996 [KR] Rep. of Korea .................... 96-60024

[51] Int. Cl.[7] ................................................. H01L 21/00
[52] U.S. Cl. ........................... 438/706; 156/345; 216/83; 216/93; 438/745
[58] Field of Search .................................... 438/706, 745; 216/83, 93; 156/345 L, 345 LC

[56] References Cited

PUBLICATIONS

Veillon et al., "Preparation of High–Purity Volatile Acids and Bases by Isothermal Distillation", Anal. Chem. vol. 53, pp. 549–550 (1981).

(Tile/Author unknown), Anal. Chem. vol. 44, No. 9, pp. 1716 (1972).

Dabeka et al., "Polypropylene for the Sub–Boiling Distillation and Storage of High–Purity Acids and Water", Anal. Chem. vol. 44, No. 8, pp. 1203–1207 (1976).

Kuehner et al., "Production and Analysis of Special High–Purity Acids Purified by Sub–Boiling Distillation", Anal. Chem. vol. 44, No. 12, pp. 2050–2056 (1972).

*Primary Examiner*—William Powell
*Attorney, Agent, or Firm*—Jones Volentine, LLP

[57] ABSTRACT

A device for concentrating chemical substances for use during the fabrication of a semiconductor device uses a sample container for holding chemical substances. A feed tube in gas flow communication with the sample container introduces a carrier gas. A vapor outlet in gas flow communication with the sample container discharges a mixture of a vapor and the carrier gas. A sample heater, disposed above and apart from the sample container, heats the chemical substances to a first predetermined temperature. A gas source supplies the carrier gas, and a gas heater, in gas flow communication with both the gas source and the feed tube, heats the carrier gas to a second predetermined temperature. A condenser in flow communication with the vapor outlet produces a liquid from the vapor, and a collecting container collects the liquid.

39 Claims, 3 Drawing Sheets

DEVICE FOR AND METHOD OF CONCENTRATING CHEMICAL SUBSTANCES FOR SEMICONDUCTOR FABRICATION

BACKGROUND OF THE INVENTION

1. Field of the Invention

The present invention relates to a device for and a method of concentrating chemical substances for fabrication of a semiconductor device and, more particularly, for treating a sample before the analysis of the chemical substances with a common analytical instrument.

2. Discussion of Related Art

With the high integration of semiconductor devices, the devices are becoming more miniaturized. However, the slightest amount of contaminants contained in the layer material formed on a wafer can have an enormous effect on the characteristics of a semiconductor. An excess of such contaminants may result in a failure in the performance of the semiconductor device. Such failures decrease the yield of the semiconductor device fabrication facility. Therefore, it is necessary to prevent as many contaminants as possible from being introduced to the semiconductor device during fabrication.

A wet cleaning process is typically employed to remove contaminants from the wafer. Chemical substances, for example, fluoric acid, nitric acid, sulfuric acid, oxygenated water and the like are used in the process. These chemical substances must be highly pure to prevent the recontamination of the wafer. To ensure purity, it is necessary to carry out a qualitative analysis and a quantitative analysis to detect even extremely small amounts of contaminants in the chemical substances. Such detection of extremely small quantities of contaminants is called microanalysis. The contaminants that need to be microanalyzed include metals such as iron (Fe), aluminum (Al) and copper (Cu), and ions such as sodium ion ($Na^+$), ammonium ion ($NH_4^+$), nitride ion ($NO_3^-$) and chloride ion ($Cl^-$). The analyses are performed with analytical instruments such as a graphite furnace atomic absorption spectrometer (GFAAS), an induced coupling plasma mass spectrometer (ICP-MS) and an ion chromatography (IC) analyzer.

To obtain detectable levels of these contaminants for quantitative analysis various distillation methods are employed. Distillation that vaporizes the matrix (i.e., the acids or oxygenated water listed above) of the chemical substances reduces the amount of matrix and thus increase the relative concentration of the impurities contained in the original chemical substances. Distillation processes that concentrate the impurities in a sample of chemical substances as a pretreatment for analysis also typically recover the vaporized matrix, such as the acid, in highly purified form.

Acid of high purity may be obtained through isopiestic distillation systems, vacuum distillation systems, and sub-boiling systems.

The isopiestic distillation, an acid distillation method based on the difference of vapor pressures, is useful for the acids of high vapor pressure such as hydrochloric acid, but not for those of low vapor pressure such as nitric acid and sulfuric acid. It is therefore not suitable for the pretreatment of most analytical samples of interest in the fabrication of semiconductor devices.

Claude Veillon et al., "Preparation of High-Purity Volatile Acids and Bases by Isothermal Distillation", Anal. Chem. vol. 53, pp. 549 (1981), discloses a preparation of volatile acids and bases of high purity by evaporating the mixture of chemical substances and highly purified water. However, the process is not applicable to acids and bases of low volatility.

Vacuum distillation may be used in distilling acids of high vapor pressure, but it is not applicable to microanalysis because of possible further contamination of the sample from the wall of the sample container during heating.

Sub-boiling systems are widely applied for concentrating an acid. These systems directly heat the chemical substances to increase the vapor pressure of the acid. The vapor is subsequently cooled in a collection area where the ambient temperature is lower than the boiling point of the acid. These systems are designed primarily for purity of the collected liquids; generally, they are not designed to prevent further contamination of the sample of chemical substances.

FIG. 1 is an example a sub-boiling system as described in Anal. Chem. vol. 44, No. 9, pp. 1716 (1972). The sub-boiling system is a two-bottle TEFLON still system comprising a sample container 111, a collecting container 112, a connection block 113 for connecting the two containers 111 and 112, a heater 115 such as an infrared lamp for heating the sample container 111, and a cooling bath 114 for cooling the collecting container 112. The collecting container 112 is emerged in the bath 114 so as to condense the vapor generated from the sample container 111. This system may be practicable in concentrating acids of low boiling point such as fluoric acid, but is not suitable for acids of high boiling point such as sulfuric acid.

Another sub-boiling system, which is disclosed in R. W. Dabeka et al., "Polypropylene for the Sub-Boiling Distillation and Storage of High-Purity Acids and Water", Anal. Chem. vol. 44, No. 8, pp. 1204 (1976), is shown in FIG. 2. It includes a sample container 211, a collecting container 212, a heater 215, a condenser 221, a collecting plate 222 fixed adjacent to the condenser 221, and a sample inlet 225. The collecting plate 222 is installed in the sample container 211 and connected to the collecting container 212. In this system, chemical substances are introduced into the sample container 211 through the sample inlet 225 and the sample container 211 is heated by the heater 215 to vaporize the chemical substances. The vaporized chemical substances are cooled in the condenser 221 and collected in the collecting container 212. This system is effective in distilling acids of relatively high boiling point such as sulfuric acid, but the system suffers some disadvantages. Too much time is required to concentrate the sample such that the sample may become contaminated. Also the system is not applicable to microanalysis due to its constructional complexity.

In Edwin C. Kuehner et al., "Preparation and Analysis of Special High-Purity Acids Purified by Sub-Boiling Distillation", Anal. Chem. vol. 44, No. 12, pp. 2051 (1972), a quartz device for still another sub-boiling system is disclosed. This quartz device is shown in FIG. 3, and includes a sample container 311, a collecting container 312, a heater 315, a condenser 321, a collecting plate 322, a liquid regulator 331, a sample feed tube 332, an evaporating container 333, and a sample outlet 334. The sample container 311 is connected to the evaporating container 333 through the liquid regulator 331 and the sample feed tube 332, and the heater 315 is provided in the evaporating container 333.

First, chemical substances in the sample container 311 are supplied to the evaporating container 333 through the liquid regulator 331 and the sample feed tube 332, and heated by the heater 315 so as to generate their vapors. The vaporized chemical substances are cooled in the condenser 321 and the resulting liquid is collected by the collecting plate 322. Then, the liquid flows to the collecting container 312 through the sample outlet 334.

This system may be applicable to acids of high boiling point such as sulfuric acid, but it also suffers drawbacks such as requiring too much time for concentrating the sample of chemical substances, contaminating the concentrated sample when the sample is moved to an analytical instrument, and not being applicable for microanalysis due to its complex construction.

In still another method of concentrating chemical substances, a quartz beaker containing the sample is placed in a Pyrex box. Nitrogen gas is passed through a HEPA filter and into the box. The sample is heated by irradiating the Pyrex box with external high-powered infrared rays originating from above the box. In addition, the sample can be heated with a hot plate provided in the bottom of the box. This method may be useful for concentrating acids with high boiling points without the burden of an air conditioner in a laboratory, but it suffers from loss of sample through the wall of the beaker and possible contamination of the sample caused by the direct heating of the Pyrex box or quartz beaker.

U.S. Pat. No. 4,263,269, discloses a method of obtaining an aqueous acid without contaminants by contacting the contaminated aqueous acid with a counter-flowing vapor. This method is not applicable to the concentration of a sample of chemical substances as a pretreatment for quantitative and qualitative analyses of the sample.

A need exists, therefore, for a system that will remove acids from a sample of chemical substances, thus concentrating the sample, without introducing further contaminants to the sample. In addition, there is a need for a system that will remove a wider range of acids more quickly than current systems. Furthermore, there is a need for a system with constructions that are not too complex for application to microanalysis.

SUMMARY OF THE INVENTION

Accordingly, the present invention is directed to a device for and a method of concentrating chemical substances for a semiconductor device that substantially overcomes one or more of the problems due to limitations and disadvantages of the related art.

The present invention provides a device for concentrating chemical substances for a semiconductor device by heating the chemical substances below the boiling point and moving the vaporized chemical substances to a condenser for condensation. This is accomplished by supplying a carrier gas to a sample container containing the chemical substances so as to form a vortex and thus move the vaporized chemical substances to a condenser for condensation.

To achieve these and other advantages, the present invention provides a device for concentrating chemical substances for fabrication of a semiconductor device, including a sample container for holding chemical substances. A feed tube in gas flow communication with the sample container at a feed opening introduces a carrier gas into the sample container. A vapor outlet in gas flow communication with the sample container at an outlet opening, discharges a mixture of a vapor and the carrier gas. A sample heater disposed above and apart from the sample container heats the chemical substances in the sample container to a first predetermined temperature. A gas source supplies the carrier gas, and a gas heater, in gas flow communication with the gas source and in gas flow communication with the feed tube, heats the carrier gas to a second predetermined temperature. A condenser in flow communication with the vapor outlet produces a liquid from the vapor, and a collecting container in flow communication with the condenser collects the liquid.

In another aspect of the invention, the sample container is cylindrically shaped so that a vortex forms in the sample container above the chemical substances to mix the vapor and the carrier gas. In other aspects of the invention, the feed tube and the vapor outlet form a feed-outlet angle, and each intersects the sample container at its own angle of declination. These aspects improve the rate at which the chemical substances are concentrated.

It is another aspect of the present invention to apply a method of concentrating chemical substances for fabrication of a semiconductor device including heating chemical substances to a first predetermined temperature in a sample container, with a light source of high energy spaced apart from the sample container, to produce a vapor of a matrix component of the chemical substances. The method includes introducing into the sample container a carrier gas supplied by a gas source and heated by a gas heater to a second predetermined temperature, so as to form a vortex in a space inside the sample container above the chemical substances. The method includes steps for extracting from the sample container a mixture of the vapor and the carrier gas, condensing from the extracted mixture a liquid of the matrix of the chemical substances, and collecting the liquid in a collection container.

BRIEF DESCRIPTION OF THE ATTACHED DRAWINGS

The accompanying drawings illustrate embodiments of the invention in which.

DETAILED DESCRIPTION OF THE INVENTION

Figure 1:
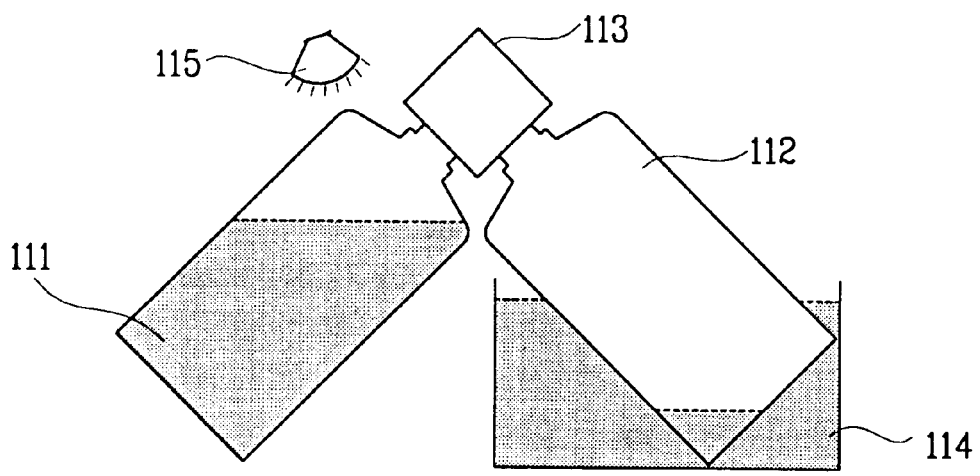
FIG. 1 is a schematic diagram showing one example of a conventional device for concentrating chemical substances.
Figure 2:
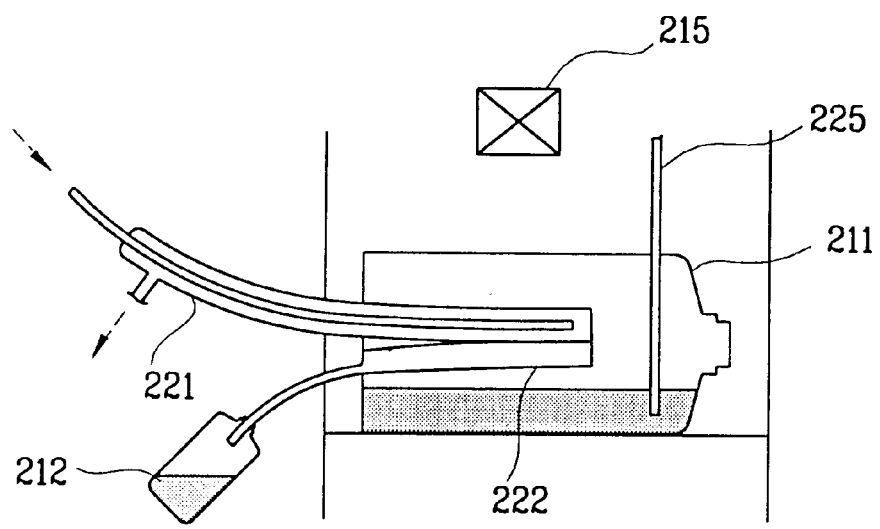
FIG. 2 is a schematic diagram showing a second example of a conventional device for concentrating chemical substances.
Figure 3:
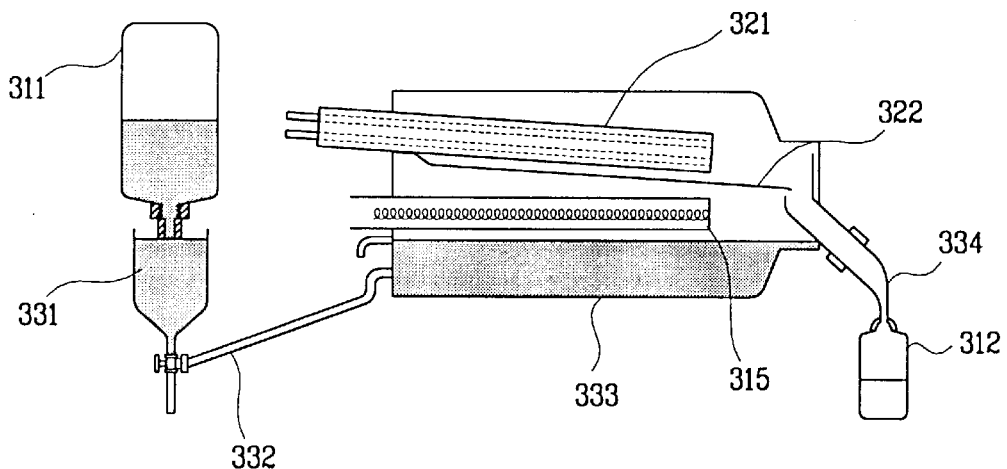
FIG. 3 is a schematic diagram showing a third example of a conventional device for concentrating chemical substances.
Figure 4:
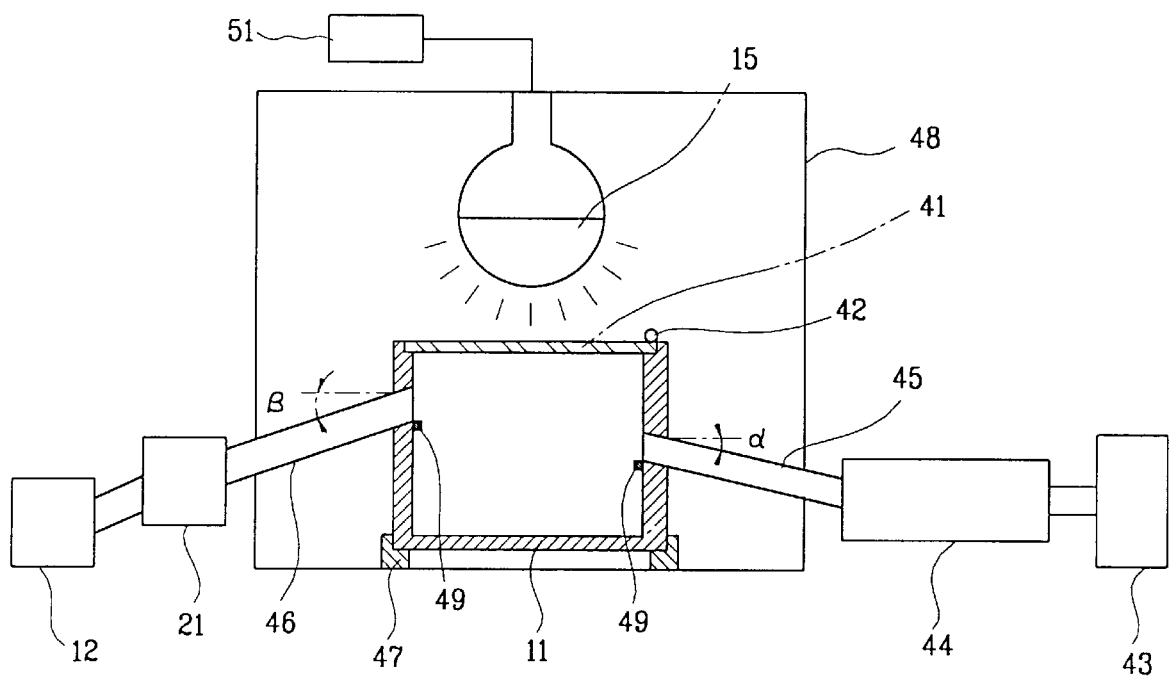
FIG. 4 is a schematic cross-section showing a device for concentrating chemical substances according to a preferred embodiment of the present invention.

The device for concentrating chemical substances in accordance with the present invention is shown in FIG. 4. Generally, a sample of chemical substances placed in a sample container 11 is heated by a heater 15, thus generating a vapor of the matrix. The matrix is at least one of the constituent chemical substances in the sample. The generated vapor is carried with a heated carrier gas through a vapor outlet 46 to a condenser 21 where the vapor is converted to a liquid. The liquid, essentially pure matrix, is collected in a collecting container 12. Heated carrier gas is introduced into the sample container 11 through a carrier gas feed tube 45. The heated carrier gas is provided by a carrier gas source 43 supplying carrier gas to a carrier gas heater 44 which is connected to the gas feed tube 45.

The concentrated chemical substances to be analyzed are formed in the sample container 11 while the matrix is removed by the process. The heater 15 is spaced apart from the container so as not to introduce particles or other contaminants into the sample container.

The sample container 11 can be any convenient shape, but in the preferred embodiment the sample container 11 has a cylindrical shape to encourage a vortex to form when the carrier gas is introduced through the gas feed tube 45 into the sample container 11. The vortex helps to mix the vapors with the carrier gas more uniformly throughout the gas space, i.e. the space inside the sample container and above the sample. To compensate for the carrier gas entering the sample container 11 through the feed tube 45, a mixture of vapor and carrier gas is discharged through the vapor outlet 46. Because the vortex enhances the mixing of the carrier gas and vapor, more vapor is included in the mixture that is discharged though the vapor outlet. Hence the device with a vortex is more effective in removing vapor from the sample container and more efficient in concentrating chemical substances in the sample.

The sample container 11 is made of a material that is chemical-resistant against the chemical substances to be concentrated and thermal-resistant against the heat supplied by the heater 15 to vaporize the matrix and concentrate the remaining chemical substances. The chemical-resistance and heat-resistance properties are important to avoid distorting the concentrated sample with new contaminants from the walls of the sample container. For example, in one embodiment, the sample container 11 is made of a synthetic resin such as a TEFLON that is scratch-resistant and heat-resistant and has excellent thermal-resistance and chemical-resistance properties. Furthermore, in the preferred embodiment, the sample container 11 is made of a transparent TEFLON which allows infrared rays through, in case the heater 15 is an infrared lamp emitting such heat rays.

The sample container 11 has a lid 41 that can be placed onto and taken off the sample container 11 so as to close and open the top. The lid 41 can be opened to provide access to the interior of the sample container 11 as necessary to place the original sample of chemical substances into the container 11 at the start of the process and to remove the concentrated chemical substances at the conclusion of the process. The lid 41 can be closed to prevent the loss of vapor and the introduction of external contaminants during the process.

The lid 41 may be made of a similar material to the rest of the sample container 11. In the preferred embodiment, for example, the lid 41 is made of a synthetic resin such as a transparent TEFLON which allows infrared rays through, in case the heater 15 is an infrared lamp emitting such heat rays. In the preferred embodiment, the lid 41 also has a handle 42 for opening the sample container 11 with ease.

The heater 15 heats the chemical substances in the sample container 11. If necessary, the sample container 11 itself can be heated. The heater 15 is installed in close proximity but spaced apart from the lid 41 to improve the efficiency of heat transfer to the chemical substances in the container 11. In the preferred embodiment, for example, the distance between the sample container 11 and the heater 15 is in the range from about 10 mm to about 40 mm. In one embodiment, the heater 15 is connected to a regulator 51 for controlling the heat generated therefrom. In the preferred embodiment, the regulator 51 employs a transformer.

The gas feed tube 45 may be installed to intersect the sample container 11 at an angle of declination α measured from a horizontal plane to the feed tube 45. The gas feed tube 45 is inclined from the gas heater 44 to the sample container 11 to force the carrier gas to flow towards the top of the sample container 11 and thus form the desired vortex more easily. In the preferred embodiment, for example, the angle α of the gas feed tube 45 is in the range from about 5 degrees to about 20 degrees. If the angle α is less than 5 degrees, the carrier gas cannot form the vortex in the sample container 11 easily. If the angle α is greater than 20 degrees, the flux of the carrier gas may be decreased because the carrier gas impinges more directly on the lid 41 of the sample container 11.

The vapor outlet 46 may be installed to intersect the sample container 11 at an angle of declination β measured from a horizontal plane to the vapor outlet 46. When the vapor outlet 46 declines from the sample container 11 to the condenser 21, the mixture of the vapor and the carrier gas flows down toward the condenser 21 more readily as the mixture cools. In the preferred embodiment, for example, the declination angle β of the vapor outlet 46 is in the range from about 8 degrees to about 30 degrees, which is experimentally determined so as to allow the gradually cooling vapor to flow easily towards the condenser 21.

Figure 5:
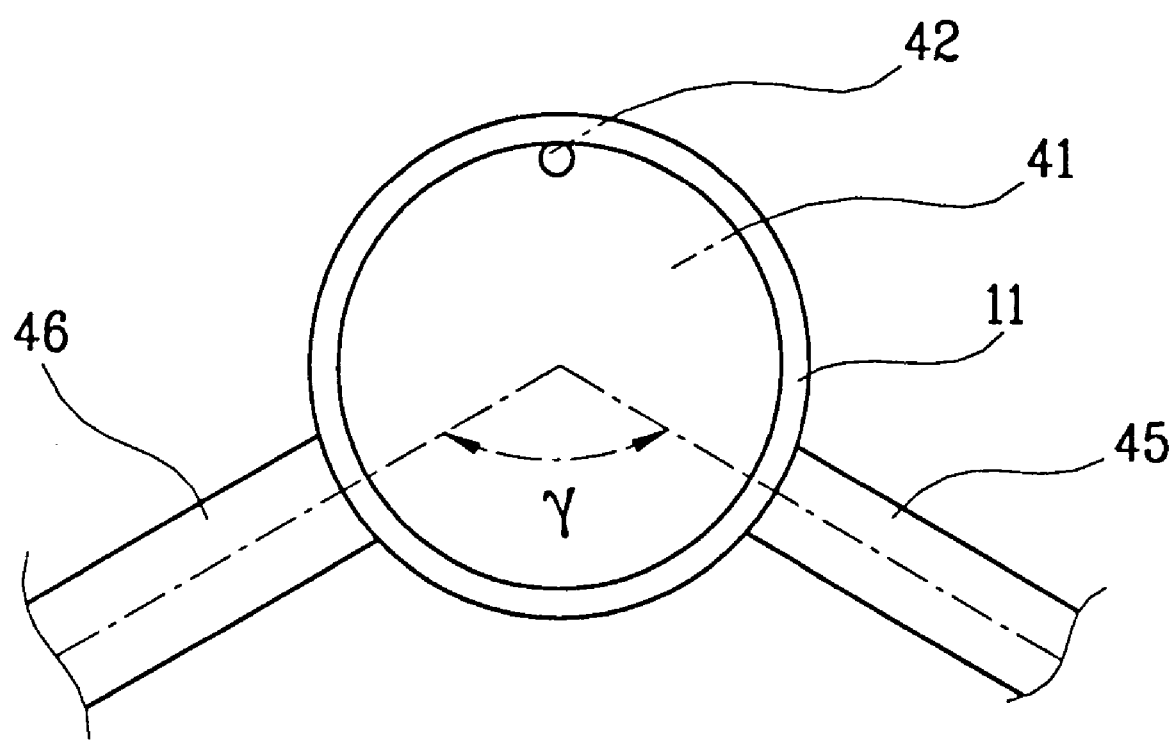
FIG. 5 is a plan diagram illustrating the connection of a gas feed tube and a vapor outlet in the embodiment shown in FIG. 4.

In one embodiment, the gas feed tube 45 and the vapor outlet 46 are installed to form an angle γ centered on the central axis of the sample container 11, as shown in FIG. 5. In the preferred embodiment, the angle γ is in the range from about 100 degrees to about 150 degrees. The angle γ is experimentally determined to make the to circulation and mixing of the carrier gas and the vapor in the sample container 11 more efficient, for example by inducing a vortex before the mixture is discharged through the vapor outlet 46.

Referring again to FIG. 4, in the preferred embodiment, the vapor outlet 46 is installed at a height in the sample container 11 that is greater than the height of the gas feed tube 45 to mix only vapor with the carrier gas discharged through the vapor outlet 46. Such a difference in height helps prevent the discharge through the vapor outlet 46 of any liquid sample due to bubbles caused by occasional abnormal boiling in the sample container 11. Thus only the vapor is liquified at the condenser 21, and only liquid matrix is collected in the collecting container 12.

In the preferred embodiment, the diameter of the gas feed tube 45 is smaller than that of the vapor outlet 46. The diameters are set so that the quantity of the carrier gas introduced through the gas feed tube 45 is equal to that of the carrier gas in the mixture discharged through the vapor outlet 46. In this manner, the air pressure in the sample container 11 is always substantially constant.

The carrier gas is provided by a gas supply source 43. A gas heater 44 rapidly heats the carrier gas itself to a predetermined constant high temperature to prevent the cooling and condensation of the vapor in the sample container 11 when the carrier gas is introduced thereto. A hot plate including a common NICHROME wire or a heat body may be used as the gas heater 44. The predetermined temperature depends on the chemical substances and their vapor pressures or boiling points. In the preferred embodiment, the predetermined temperature of the carrier gas is selected in the range from about 180° C. to about 300° C.

A housing 48 encloses the sample container 11 and the heater 15 to protect them against external shocks or heat, and prevents the undesired cooling of the sample container 11. Therefore, in the preferred embodiment the housing 48 is made of a material having excellent heat-resistant and adiabatic properties, for example, from plates of a glass such as quartz, Pyrex and the like, or from a synthetic resin.

A support 47 is positioned under the sample container 11 at the bottom of the housing 48. The support 47 prevents the loss of heat from the sample container 11 by reducing the contact area of the bottom surface of the container 11 with the housing 48.

Stoppers 49 are disposed on the inner wall of the sample container 11, just below the feed opening where the gas feed tube 45 is connected to the sample container 11 and just below the outlet opening where the vapor outlet 46 is connected to the sample container 11. The stoppers 49 prevent the liquid chemical substances from discharging out of the sample container 11 through the gas feed tube 45 and the vapor outlet 46 even when the chemical substances are splattering and bubbling due to overheating in the sample container 11. The stoppers 49 are provided on the inner wall of the sample container 11 as a separate part attached to the container 11 or as an integral part of the sample container 11 itself.

The invention includes the method of concentrating chemical substances for fabrication of a semiconductor device. The method of the present invention includes the steps of heating a sample of chemical substances in the sample container 11 with a light source of high energy spaced apart from the sample container 11 to produce a vapor of the matrix of the chemical substances. The next step involves introducing a heated carrier gas into the sample container 11 so as to form a vortex. The carrier gas is supplied from the gas supply source 43 and heated by the gas heater 44. After mixing with the vapor in the sample container 11, the carrier gas mixed with the vapor of the matrix is discharged from the sample container 11. The method then involves extracting the mixture, condensing the vapor to form essentially pure liquid matrix of the chemical substances, and collecting the liquid matrix.

According to the present invention, the chemical substances are directly heated to a temperature below the boiling point of the chemical substances thereby generating a vapor of the matrix without liquid bubbles. The matrix vapor is carried into the condenser 21 so as to condense and liquefy and collect essentially pure matrix in the collecting container 12. This removal of matrix from the chemical substances concentrates the impurities in the sample placed in the sample container 11.

The chemical substances are directly heated by a heater 15 which is a light source of high energy such as a general infrared lamp. The chemical substances can also be indirectly heated by heating the sample container 11.

If the sample container 11 is made of quartz, there is no practical temperature limit. However, if the sample container 11 is made of a synthetic resin such as a TEFLON, the uppermost temperature must be limited. Furthermore, the boiling point of the chemical substances is also important. Thus the heating may be regulated according to the materials of the sample container 11 and the chemical substances. For example, the sample container 11 may be heated up to 250° C., and, in the preferred method, only up to 230° C.

The carrier gas is supplied into the sample container 11 so as to form a vortex and is discharged as a mixture with the vapor of the matrix of the chemical substances. The vortex, which is caused by the supply of the carrier gas through the gas feed tube 45, helps effectively discharge the vapor from throughout the gas space of the sample container 11.

The carrier gas is an inert gas so as to prevent a reaction between the carrier gas and the highly heated chemical substances. In the preferred method, the carrier gas is nitrogen gas. The carrier gas is heated by the gas heater 44, for example to a temperature in the range from about 180° C. to about 300° C. The carrier gas is heated to prevent the vaporized matrix of the chemical substances from being condensed back in the sample container 11 when the carrier gas is introduced to the sample container 11 through the gas feed tube 45.

Consequently, the method of concentrating chemical substances for fabrication of a semiconductor device in accordance with the present invention as described above comprises the steps of placing the sample of chemical substances into the sample container 11, heating the sample container 11 by the heater 15 which is provided above and apart from the container 11, heating the inert carrier gas of the gas supply source 43 by passing it through the gas heater 44, introducing the carrier gas to the sample container 11 through the gas feed tube 45 so as to form a mixture of the vaporized matrix of the chemical substances and the carrier gas, moving the mixture to the condenser 21 through the vapor outlet 46 for condensation, collecting the liquefied matrix of the chemical substances in the collecting container 12, and discharging the carrier gas to the atmosphere. The sample in the sample container 11 is therefore concentrated while the matrix is removed by the process described.

When 140 ml of sulfuric acid was concentrated according to the present invention, the volume was decreased by 30 ml in one hour and by about 50 ml in two and a half hours. From this experiment, we conclude that the present invention considerably reduces the time for concentration in comparison with the prior art which requires several more hours or several days to achieve the same degree of concentration. Furthermore, the methods in the prior art are not as appropriate for microanalysis because of additional problems with contamination of the sample and complexity of construction.

In particular, the present invention is applicable to the pretreatment for quantitative and qualitative analyses with analytical instruments such as a graphite furnace atomic absorption spectrometer (GFAAS), an induced coupling plasma mass spectrometer (ICP-MS) and an ion chromatography (IC) analyzer, in that the volume of the concentrated chemical substances is reduced to a relatively small volume and thus the contaminants contained in the substances are concentrated by regulating the time for concentration.

It will be apparent to those skilled in the art that various modifications and variations can be made in the device for and the method of concentrating chemical substances for fabricating a semiconductor device according to the present invention without departing from the spirit or scope of the invention. Thus, it is intended that the present invention cover the modifications and variations of this invention provided they come within the scope of the appended claims and their equivalents.

What is claimed is:

1. A device for concentrating chemical substances for fabrication of a semiconductor device, comprising:

a sample container for holding chemical substances therein;

a feed tube in gas flow communication with the sample container at a feed opening, for introducing a carrier gas into the sample container;

a vapor outlet in gas flow communication with the sample container at an outlet opening, for discharging a mixture of a vapor and the carrier gas;

a sample heater for heating the chemical substances in the sample container to a first temperature, disposed above and apart from the sample container;

a gas source for supplying the carrier gas;

a gas heater in gas flow communication with the gas source and in gas flow communication with the feed tube, for heating the carrier gas to a second temperature;

a condenser in flow communication with the vapor outlet for producing a liquid from the vapor; and a collecting container in flow communication with the condenser for collecting the liquid.

2. The device of claim 1, the sample container including a lid for accessing an interior of the sample container from above the sample container.

3. The device of claim 2, wherein the lid is made of a transparent synthetic resin which allows infrared rays through the lid.

4. The device of claim 3, wherein the sample container is cylindrically shaped so that a vortex forms in the sample container above the chemical substances to mix the vapor and the carrier gas.

5. The device of claim 4, wherein the sample container is made of a material which does not interact with the chemical substances after being concentrated, and which can withstand the first temperature and the second temperature.

6. The device of claim 5, wherein the sample container is made of a synthetic, heat-resistant, scratch-resistant resin.

7. The device of claim 6, wherein the synthetic resin is transparent.

8. The device of claim 2, wherein the sample heater is spaced from the lid.

9. The device of claim 8, wherein the sample heater is spaced about 10 mm to about 40 mm from the lid.

10. The device of claim 1, further comprising a regulator connected to the sample heater, for adjusting the quantity of heat generated from the sample heater.

11. The device of claim 10, wherein the regulator comprises a transformer.

12. The device of claim 1, wherein the first temperature is in a range up to 250° C.

13. The device of claim 1, wherein the first temperature is in a range up to 230° C.

14. The device of claim 1, wherein the feed tube intersects the sample container at a feed angle of declination measured from a horizontal plane to the feed tube.

15. The device of claim 14, wherein the feed angle is in a range from about 5 degrees to about 20 degrees.

16. The device of claim 1, wherein the vapor outlet intersects the sample container at an outlet angle of declination measured from a horizontal plane to the vapor outlet.

17. The device of claim 16, wherein the outlet angle is in a range from about 8 degrees to about 30 degrees.

18. The device of claim 1, wherein the feed tube and the vapor outlet form an feed-outlet angle centered on a central axis of the sample container.

19. The device of claim 18, wherein the feed-outlet angle is in a range from about 100 degrees to about 150 degrees.

20. The device of claim 1, wherein a feed height of the feed opening and an outlet height of the outlet opening are different.

21. The device of claim 20, wherein the feed height is less than the outlet height.

22. The device of claim 1, wherein a feed diameter of the feed tube is smaller than an outlet diameter of the vapor outlet.

23. The device of claim 1, wherein the second temperature is in a range from about 180° C. to about 300° C.

24. The device of claim 1, further comprising a support disposed below the sample container.

25. The device of claim 1, further comprising a housing enclosing the sample container and the sample heater.

26. The device of claim 24, further comprising a housing enclosing the sample container and the sample heater and the support.

27. The device of claim 25, wherein the housing is made of a material having heat-resistant and adiabatic properties suitable for maintaining the sample container substantially at the first temperature.

28. The device of claim 27, wherein the housing is made of a glass.

29. The device of claim 27, wherein the housing is made of a synthetic resin.

30. The device of claim 1, the sample container including:

a first stopper on an interior wall, disposed below the feed opening; and a second stopper on the interior wall, disposed below the outlet opening.

31. The device of claim 1, wherein the carrier gas is an inert gas.

32. The device of claim 31, wherein the carrier gas is nitrogen gas.

33. A device for concentrating chemical substances for fabrication of a semiconductor device, comprising:

a cylindrically shaped sample container for holding chemical substances therein, made of a synthetic heat-resistant and scratch-resistant polymer, including a lid for accessing an interior of the sample container from above the sample container, wherein the lid is made of a transparent synthetic resin which allows infrared rays through the lid, including a first stopper on an interior wall disposed below a feed opening and a second stopper on the interior wall disposed below an outlet opening;

a support disposed below the sample container;

a feed tube having a feed diameter, in gas flow communication with the sample container at the feed opening, intersecting the sample container at a feed angle of declination measured from a horizontal plane in a range from about 5 degrees to about 20 degrees, for introducing a carrier gas into the sample container, wherein the feed opening is at a feed height;

a vapor outlet in gas flow communication with the sample container at the outlet opening, intersecting the sample container at an outlet angle of declination measured from a horizontal plane in a range from about 8 degrees to about 30 degrees, forming a feed-outlet angle with the feed tube centered on a central axis of the sample container in a range from about 100 degrees to about 150 degrees so that a vortex forms in the sample container above the chemical substances to mix a vapor and the carrier gas, for discharging a mixture of the vapor and the carrier gas, wherein the outlet opening is at an outlet height greater than the feed height, wherein an outlet diameter of the vapor outlet is greater than the feed diameter;

a sample heater for heating the chemical substances in the sample container to a first temperature in a range up to 250° C., disposed a distance above and apart from the sample container wherein the distance is in a range from about 10 mm to about 40 mm;

a housing enclosing the sample container and the sample heater and the support, made of a material having heat-resistant and adiabatic properties suitable for maintaining the sample container substantially at the first temperature;

a regulator comprising a transformer connected to the sample heater, for adjusting the quantity of heat generated from the sample heater;

a gas source for supplying the carrier gas, wherein the carrier gas is nitrogen gas;

a gas heater in gas flow communication with the gas source and in gas flow communication with the feed tube, for heating the carrier gas to a second temperature in a range from about 180° C. to about 300° C.;

a condenser in flow communication with the vapor outlet for producing a liquid from the vapor; and a collecting container in flow communication with the condenser for collecting the liquid.

34. A method of concentrating chemical substances for fabrication of a semiconductor device, comprising:

heating chemical substances to a first temperature in a sample container, with a light source of high energy spaced apart from the sample container, to produce a vapor of a matrix component of the chemical substances;

introducing into the sample container a carrier gas supplied by a gas source and heated by a gas heater to a second temperature, so as to form a vortex in a space inside the sample container above the chemical substances;

extracting from the sample container a mixture of the vapor and the carrier gas;

condensing, from the extracted mixture, a liquid of the matrix of the chemical substances; and collecting the liquid in a collection container.

35. The method of claim 34, wherein during the heating the first temperature is in a range up to 250° C.

36. The method of claim 34, wherein during the heating the first temperature is in a range up to 230° C.

37. The method of claim 34, wherein during the introducing the carrier gas is an inert gas.

38. The method of claim 34, wherein during the introducing the carrier gas is a nitrogen gas.

39. The method of claim 34, wherein during the introducing the second temperature is in a range from about 180° C. to about 300° C.

* * * * *